United States Patent [19]

Ayasli

[11] Patent Number: 4,801,901

[45] Date of Patent: Jan. 31, 1989

[54] NON-FERRITE NON-RECIPROCAL PHASE SHIFTER AND CIRCULATOR

[75] Inventor: Yalcin Ayasli, Lexington, Mass.

[73] Assignee: Hittite Microwave Corporation, Woburn, Mass.

[21] Appl. No.: 25,594

[22] Filed: Mar. 13, 1987

[51] Int. Cl.[4] .................. H01P 1/32; H01P 1/397; H03H 11/02; H03H 11/16
[52] U.S. Cl. .................................. 333/1; 307/262; 333/1.1; 333/138; 333/164
[58] Field of Search .............. 333/1, 1.1, 109, 138, 333/164, 115, 24.1, 160; 328/56, 24, 155; 307/262; 330/151

[56] References Cited

U.S. PATENT DOCUMENTS

| | | | |
|---|---|---|---|
| 3,187,274 | 6/1965 | Owen et al. | 333/1.1 |
| 3,517,223 | 6/1970 | Gaunt, Jr. | 328/155 X |
| 3,544,999 | 12/1970 | Michelson | 333/1.1 X |
| 3,667,065 | 5/1972 | Beurrier et al. | 330/151 X |
| 3,700,832 | 10/1972 | Beurrier | 333/1.1 X |
| 3,860,893 | 1/1975 | Ropars et al. | 333/1.1 X |
| 4,266,204 | 5/1981 | Jacoby | 330/151 X |

FOREIGN PATENT DOCUMENTS 2337072 11/1974 Fed. Rep. of Germany ....... 333/1.1
115044 9/1979 Japan ................................... 333/1.1

OTHER PUBLICATIONS

Moghe et al., *A Monolithic Direct-Coupled GaAs IC Amplifier with 12-Ghz Bandwidth*, IEEE Trans. on MTT, Dec. 1984, pp. 1698, 1699 cited.

Niclas, *Multi-Octave Performance of Single-Ended Microwave Solid-State Amplifiers*, IEEE Trans. on MTT, Aug. 1984, pp. 896, 897, 903 cited.

*Primary Examiner*—Paul Gensler
*Attorney, Agent, or Firm*—Joseph S. Iandiorio; Brian M. Dingman

[57] ABSTRACT

A non-reciprocal phase shifter including a transmission medium connected between first and second terminals and having a predetermined phase shift which is the same in each direction and an amplifier circuit connected between the first and second terminals for introducing its inherent phase shift in one direction and a phase shift in excess of its inherent phase shift in the other direction for establishing a non-reciprocal phase shift; and a circulator made from such a phase shifter.

14 Claims, 4 Drawing Sheets

NON-FERRITE NON-RECIPROCAL PHASE SHIFTER AND CIRCULATOR

FIELD OF INVENTION

This invention relates to an improved circulator, and more particularly to a non-ferrite, non-reciprocal phase shifter capable of monolithic construction.

BACKGROUND OF INVENTION

Conventional three-port ferrite circulators have widespread use in duplexing, for example, a single microwave antenna with both a transmitter and receiver. Due to the non-reciprocal operation of such devices they also act as good isolators. Four-port circulators are also available for providing even greater isolation than the three-port circulators. For example, in a three-port terminal connecting a transmitter, antenna and receiver, the antenna mismatch may be passed to the transmitter if there is a reflection caused by receiver mismatch. A four-port circulator avoids this problem with the provision of a fourth port which can independently absorb any reflections. Such a four-port device is typically even bigger and more expensive than the three-port variety: it includes a combination of directional couplers and/or magic-Tees with two non-reciprocal phase shifting transmission lines between them. One shortcoming of both the three- and four-port circulators is that they must be sized corresponding to the wavelength of the energy so that circulators typically are not made for use below the microwave range. Typical sizes range from one half inch to two or three inches in diameter, which precludes integral monolithic fabrication with associated circuitry. In addition, present ferrite circulators require permanent magnet bias and non-magnetic housings. Recently, proposals for reduced-size lumped circulators using ferrite have met with indifferent success because the capacitive coupling prevents them from being useful in microwave ranges or above. At much lower frequencies the ferrite losses are prohibitive in lumped circulators, making them unattractive.

SUMMARY OF INVENTION

It is therefore an object of this invention to provide an improved non-reciprocal phase shifter for use in circulators.

It is a further object of this invention to provide an improved circulator which is smaller, simpler and less expensive.

It is a further object of this invention to provide an improved circulator which does not rely on ferrite materials.

It is a further object of this invention to provide an improved circulator which requires no permanent magnet bias or non-magnetic housing.

It is a further object of this invention to provide an improved circulator whose size is independent of wavelength.

It is a further object of this invention to provide an improved circulator which can easily be formed as a monolithic integrated circuit and combined with associated circuits such as transmitters and receivers on a single chip.

The invention results from the realization that a non-ferrite circulator of extremely small size and capable of monolithic fabrication can be effected using phase shifters made with a bidirectional transmission medium and an amplifier which introduces one phase shift in one direction and a larger phase shift in the other direction.

This invention features a bidirectional phase shifter including a transmission connected between first and second terminals and having a predetermined phase shift which is the same in each direction. An amplifier circuit is connected between the first and second terminals for introducing its inherent phase shift in one direction and causing a phase shift in excess of its inherent phase shift in the other direction for establishing a non-reciprocal phase shift.

In preferred embodiments the amplifier circuit includes an amplifier and coupling means for interconnecting the amplifier with the first and second terminals. The coupling means may be capacitors and the amplifier may be a transistor with one electrode grounded and the other two electrodes connected one to each of the first and second terminals.

Alternatively, the amplifier circuit may have three ports, one connected to the first terminal, one connected to the second terminal, and one connected to a third terminal intermediate the first and second terminals. The transmission medium introduces approximately a 90° phase shift and the amplifier circuit introduces an inherent phase shift of approximately 180°. There may be impedance matching circuits connected to each of the terminals.

The invention also features a circulator such as a three-port circulator made by combining such phase shifters. Three such bidirectional phase shifters may be combined in a ring so that the first terminal of each shifter is interconnected with the second terminal of another. Alternatively, the first terminal of each phase shifter is interconnected with the second terminal of another phase shifter through at least one impedance matching element.

The invention also features a four-port circulator having at least one non-reciprocal bi-directional phase shifter, and a second bi-directional phase shifter which may be non-reciprocal or reciprocal. There is also a passive four-port coupling network which couples the two bi-directional phase shifters. One or both of the couplers may be magic T couplers or one or both of the couplers may be directional couplers, or one coupler may be a magic T coupler while the other is a directional coupler.

DISCLOSURE OF PREFERRED EMBODIMENT

Other objects, features and advantages will occur from the following description of a preferred embodiment and the accompanying drawings, in which.

The bidirectional phase shifter of this invention may be accomplished using a transmission medium connected between first and second terminals having a predetermined phase shift which is the same in each direction. Such a transmission medium may include a conventional transmission line, or a lumped element transmission line, or a loaded transmission line, or any other wave transmission medium in which the propagating wave sees a phase shift. There is an amplifier circuit connected between the first and second terminals for introducing its inherent phase shift in one direction and the phase shift in excess of its inherent phase shift in the other direction for establishing a non-reciprocal phase shift. The amplifier circuit may include an amplifier of unity gain or less or a simple transistor, so long as it is an active circuit element and passes current in one direction only. The amplifier circuit may also include coupling means such as capacitors for interconnecting the amplifier with the first and second terminals. If the amplifier is simply a transistor it may be arranged with one electrode grounded and the other two electrodes connected one to each of the first and second terminals. Or the transmission medium may be in two parts with an intermediate terminal between them and the amplifier or transistor may have three ports or electrodes, one connected to each of the first and second terminals with the third electrode connected to a third terminal intermediate the first and second. The transmission medium may introduced approximately a 90° phase shift while the amplifier circuit introduces an inherent phase shift of approximately 180° in the forward direction, while in the reverse direction it introduces a phase shift of 270° because wave propagation cannot occur in the reverse direction. In the reverse direction the path is through the transmission medium in the reverse direction, then in the forward direction through the amplifier, and then again in the forward direction through the transmission medium. Impedance circuits may be provided with each of the terminals to provide, for example, a typical 50 ohm matching impedance.

These bidirectional phase shifters may be connected together end to end in a ring to produce a typical three-port circulator, and impedance circuits may be used to provide impedance matching with the associated circuitry.

Figure 1:
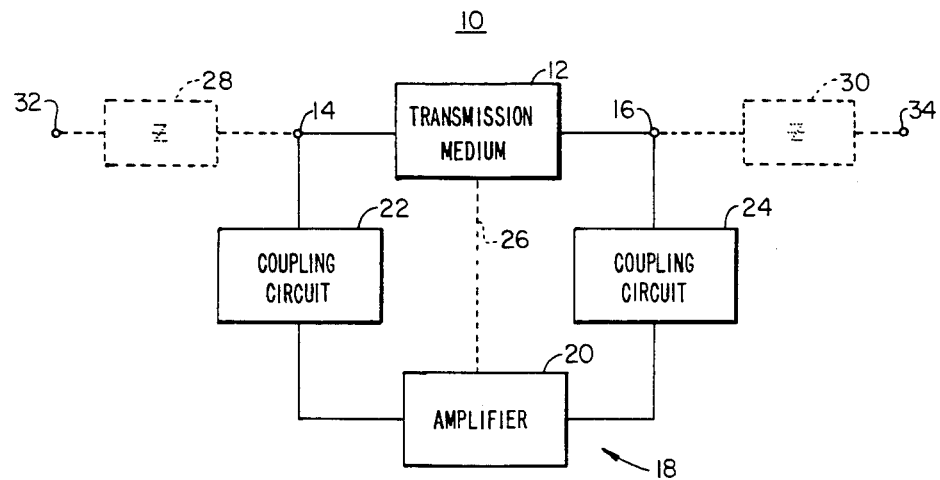
FIG. 1 is a block diagram of a phase shifter according to this invention.

There is shown in FIG. 1 a phase shifter 10 according to this invention which includes a transmission medium 12 interconnected between the first terminal 14 and the second terminal 16. Also connected between those terminals is an amplifier circuit 18 which may include amplifier 20 and coupling circuits 22 and 24. In some embodiments, amplifier 20 may have a third port interconnected with an intermediate terminal indicated in FIG. 1 by phantom line 26. An impedance circuit 28 may be connected between first terminal 14 and input terminal 32, and impedance circuit 30 may be interconnected between second terminal 16 and output terminal 34, for purposes of impedance matching.

Figure 2:
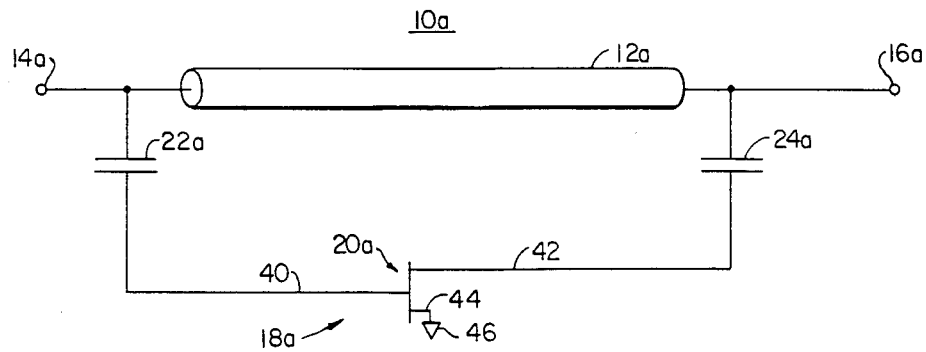
FIG. 2 is a schematic diagram of one implementation of the phase shifter of FIG. 1.
Figure 3:
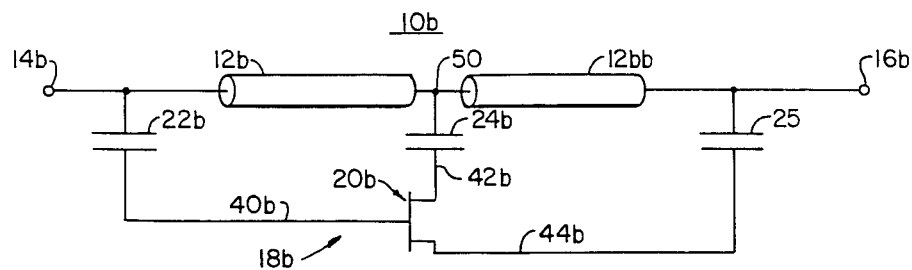
FIG. 3 is an alternative implementation of the phase shifter of FIG. 1.

In one specific construction, phase shifter 10a, FIG. 2, may include a conventional transmission line 12a coupled to an amplifier circuit 18a which includes coupling capacitors 22a and 24a and a transistor 20a. The control electrode 40 of transistor 20a is connected to terminal 14a through capacitor 22a. One of the load electrodes 42 is connected through capacitor 24a to second terminal 16a. The other load electrode 44 is connected to ground 46.

In an alternative construction, phase shifter 10b includes a transmission line having two sections 12b and 12bb with an intermediate terminal 50 between them. Here amplifier 18b includes a transistor 20b whose control electrode 40b is connected through capacitor 22b to first terminal 14b. One load electrode 42b is connected to terminal 50 through capacitor 24b while the other load electrode 44b is connected not to ground but to second terminal 16b through capacitor 25. It should be understood that while there is reference made to an amplifier circuit, the illustrations indicate that the amplifier may have the simplest implementation; it may have a gain of unity or less; it may perform other functions.

Figure 4:
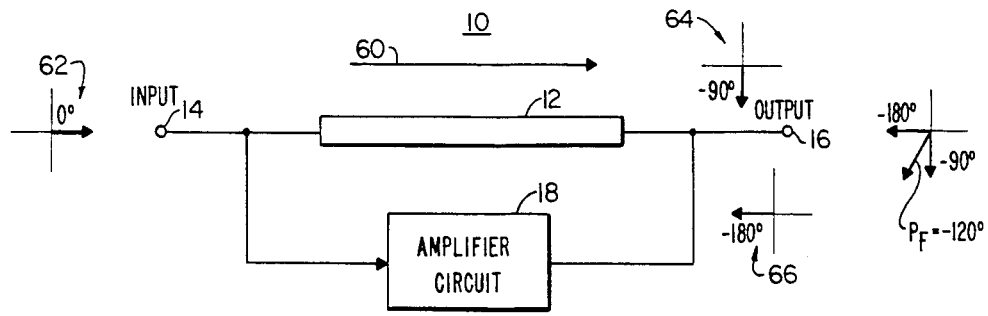
FIG. 4 is a diagrammatic view showing the forward phase shift introduced by the phase shifter of FIG. 1.
Figure 5:
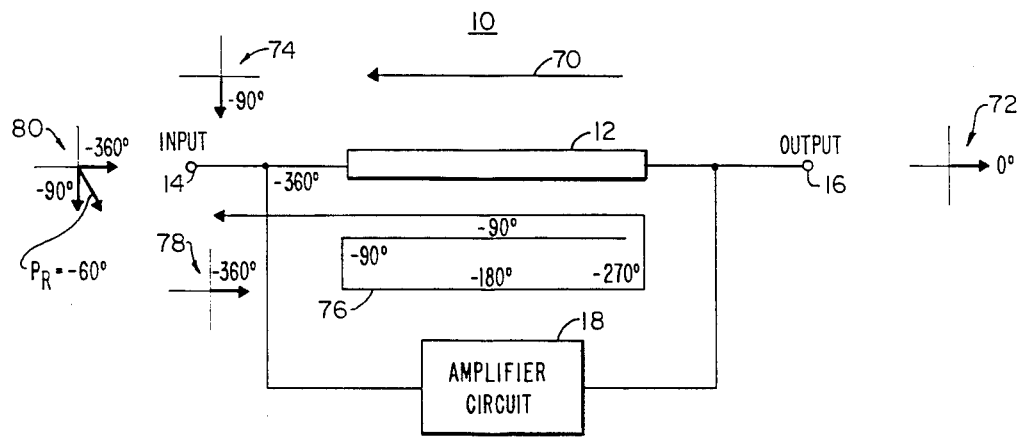
FIG. 5 is a diagram showing the reverse phase shift introduced by the phase shifter of FIG. 1.

The phase shift accomplished according to this invention may be better understood with reference to FIGS. 4 and 5. In FIG. 4 the phase shifter according to this invention is shown schematically with the forward direction indicated by arrow 60. It is assumed for purposes of this explanation that transmission medium 12 has a phase shift of $-90°$ while the amplifier circuit 18 has an inherent phase shift of $-180°$. A signal input at first terminal 14 has a phase of 0° as indicated by phase diagram 62. After passing through transmission medium 12, that same signal arrives at the output at second terminal 16 having a phase of $-90°$ as indicated by phase diagram 64. Simultaneously, the signal moves through amplifier 18 and arrives at the output at terminal 16 having a phase of $-180°$ as indicated by phase diagram 66. These combined values produce a forward phase vector $P_f$ of $-120°$, for example.

Figure 6:
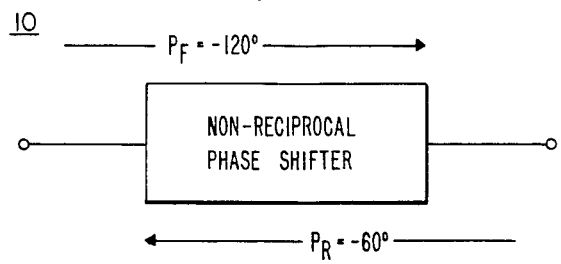
FIG. 6 is an illustration of the non-reciprocal phase shifting produced by the phase shifter according to this invention.

In the reverse phase direction, as indicated by arrow 70, FIG. 5, the input signal at terminal 16 has a phase of 0° as indicated in phase diagram 72. After the signal passes through medium 12 and arrives at terminal 14, it has a phase of $-90°$ as indicated in phase diagram 74. Simultaneously, a portion of the same signal, unable to enter amplifier circuit 18 in the reverse direction, also moves through transmission medium 12 where it picks up a $-90°$ phase shift. This can be seen by following the spiral arrow 76. The signal then passes through amplifier 18, where it picks up an additional $-180°$ phase shift for a total of $-270°$. It then once again moves through transmission medium 12, where it picks up an additional 90° phase shift for a total of $-360°$ phase shift as indicated in the phase diagram 78. These two phase shifts provide a total phase reverse $P_r$ shift of $-60°$ as indicated by phase diagram 80. Thus the non-reciprocal phase shifter 10 of this invention, FIG. 6, provides a phase forward $P_f$ phase shift of $-120°$ and a phase reverse $P_r$ of $-60°$.

Figure 7:
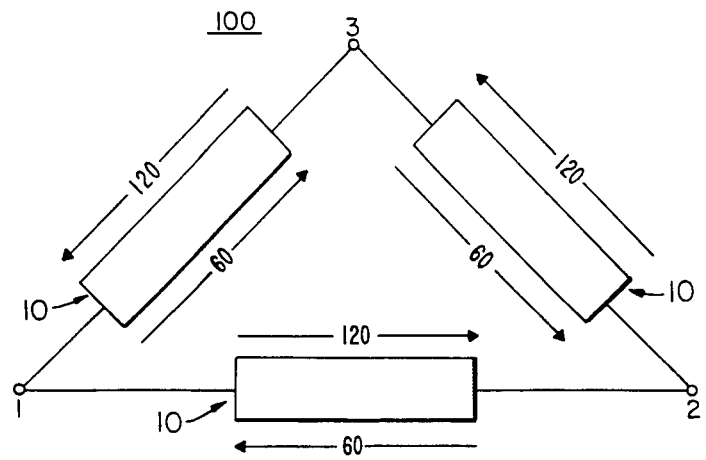
FIG. 7 is a diagram illustrating the circulator function and isolation produced by the phase shifters of FIG. 6 in a circulator configuration.

When such phase shifters are connected together in the form of a three-port circulator 100, FIG. 7, it can be seen that they provide the isolation function characteristic of circulators. For example, moving from circulator port 1 in FIG. 7 to circulator port 2 in the forward direction, phase shift $P_{1-2}$ is equal to $-120°$. The other path between circulator ports 1 and 2, path 1-3-2, produces a phase shift $P_{1-3-2}$ of $-120°$. Thus in both directions the phase shift is the same, −120°, and they combine and reinforce so that the signal input at circulator port 1 is transmitted to port 2. However, this is not the case with respect to port 3. The phase shift along path 1-3, $P_{1-3}$, is −60°. The phase shift $P_{1-2-3}$ along the other path to port 3 is −240°, so the signals are out of phase at port 3. They cancel, and so port 3 is isolated.

Figure 8:
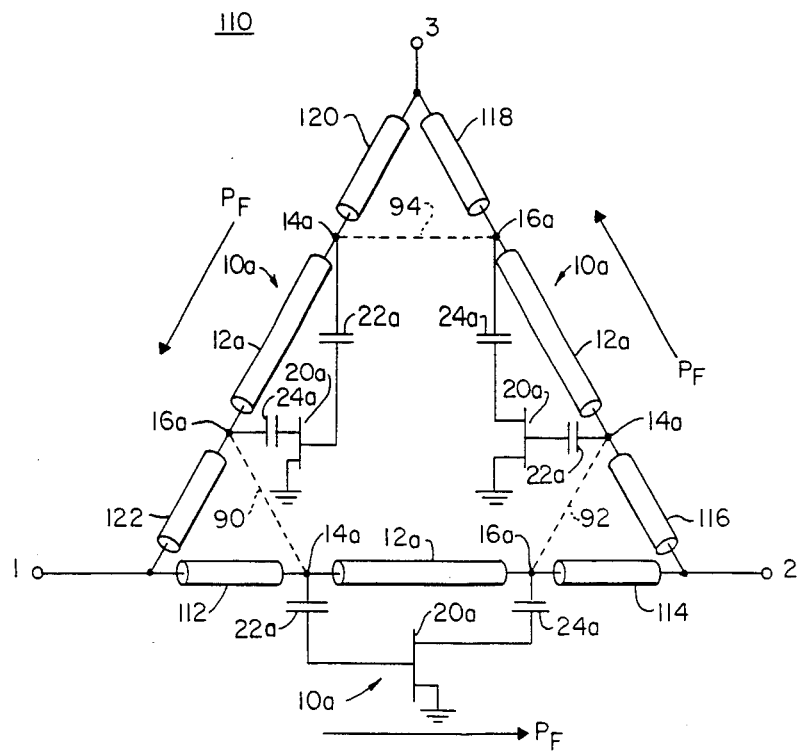
FIG. 8 is a schematic diagram of a three-port circulator according to this invention which may be constructed using the phase shifter of FIG. 1.

A three-port circulator 110 made with the phase shifter 10 of FIG. 1 of this invention, implemented as shown in FIG. 2, is shown in FIG. 8, where three identical phase shifters 10a have been connected end to end. The first terminal 14a of each phase shifter 10a may be connected directly to the second terminal 16a of the adjacent phase shifter 10a as indicated by dashed lines 90, 92 and 94. The preferred construction in FIG. 8 includes impedance circuits 112, 114; 116, 118; and 120, 122, for the purposes of matching the impedance so that it appears the same at each of the ports 1, 2 and 3.

Figure 9:
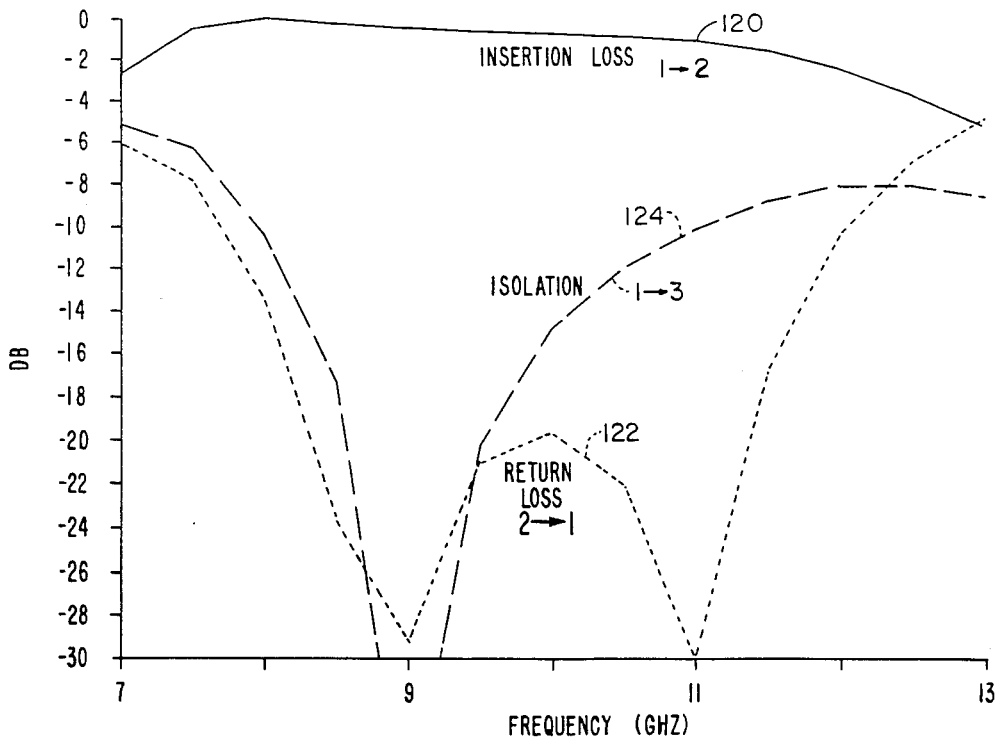
FIG. 9 is an illustration of the performance characteristics of an X-band circulator according to this invention.

The practicality of the circulator according to this invention can be seen with respect to the calculated performance of an X-band circulator according to this invention shown in FIG. 9. There the insertion loss, line 120, from port 1 to port 2 is barely 1 DB down in the area of interest, namely 9 GHz. The return loss 122 for reflections from port 2 back to port 1 is down over 29 DBs, while the isolation 124 between ports 1 and 3 is off scale, well below 30 DB down.

Figure 10:
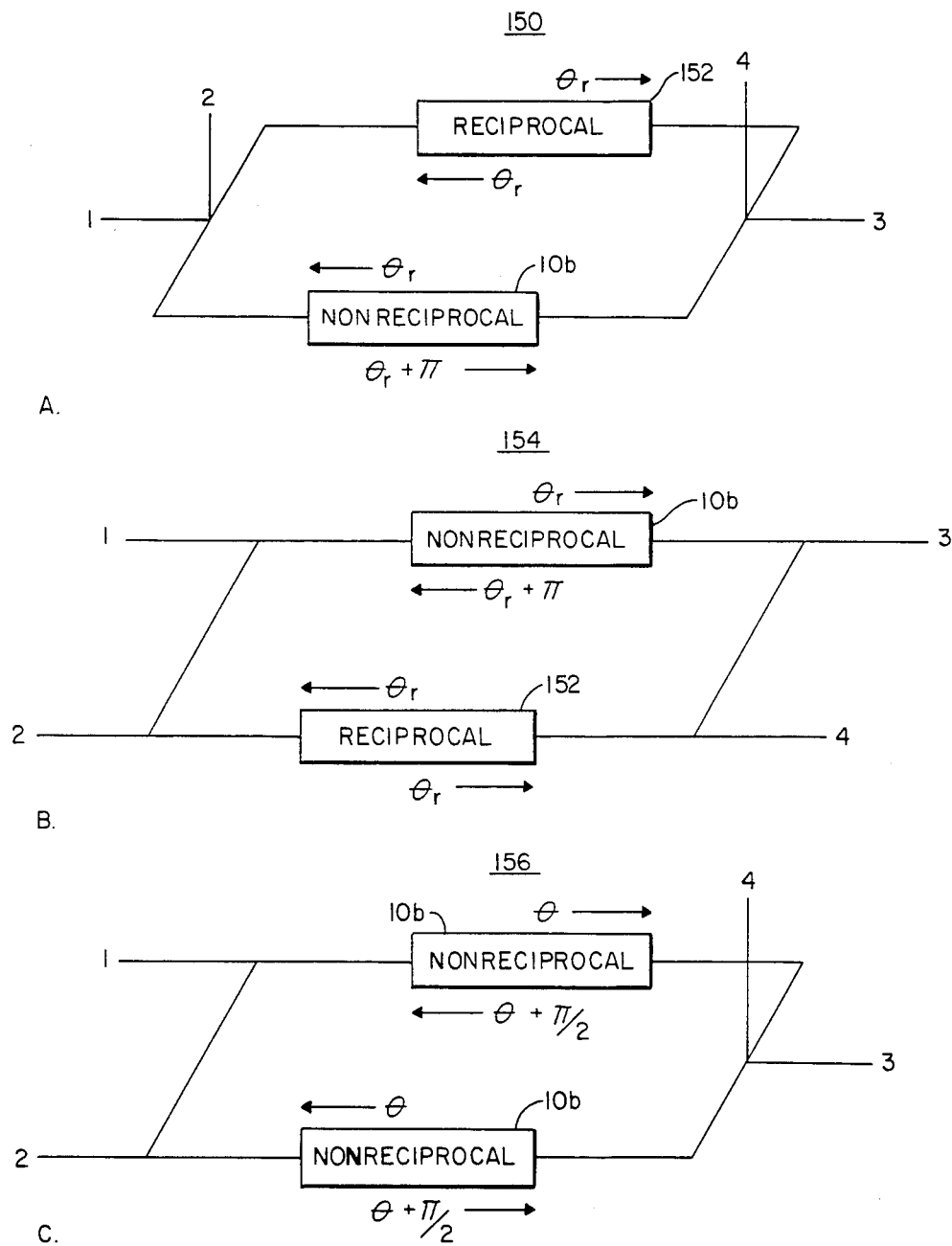
FIGS. 10A–C are schematic views of other different constructions of four-port circulators using phase shifters according to this invention.

A four-port circulator 150 according to this invention can be made having four ports 1, 2, 3 and 4, FIG. 10A, which provides a phase shift in one direction of $\theta_r$ and in the opposite direction of $\theta_r + \pi$ by using a non-reciprocal bi-directional phase shifter 10b in conjunction with a reciprocal phase shifter 152. Ports 1 and 2 are in the "magic-T" configuration and ports 3 and 4 are also in the "magic-T" configuration. Reciprocal phase shifter 152 provides the same phase shift, $\theta_r$, in both directions. The non-reciprocal phase shifter produces a phase shift of $\theta_r$ in one direction and $\theta_r + \pi$ in the other direction.

Alternatively, reciprocal phase shifter 152 and non-reciprocal phase shifter 10b can be combined in a four-port circulator 154, FIG. 10B, in which the four ports are connected as two directional couplers 1, 2 and 3, 4. In another construction, four-port circulator 156 is constructed with ports 1 and 2 as a directional coupler and ports 3 and 4 as a "magic-T" connection.

Although specific features of this invention are shown in some drawings and not others, this is for convenience only as each feature may be combined with any or all of the other functions in accordance with the invention.

Other embodiments will occur to those skilled in the art and are within the following claims:

What is claimed is:

1. A non-reciprocal bi-directional phase shifter comprising:
   a monolithic, non-ferrite circuit including:
   a transmission medium connected between first and second terminals and having a predetermined phase shift which is the same is each direction; and
   an amplifier circuit connected in parallel with the transmission medium between the first and second terminals, said amplifier circuit operating to introduce its inherent phase shift in one direction and a phase shift in excess of its inherent phase shift in the other direction for establishing a non-reciprocal phase shift between said first and second terminals.

2. The phase shifter of claim 1 in which said amplifier circuit includes an amplifier and coupling means for interconnecting said amplifier with said first and second terminals.

3. The phase shifter of claim 2 in which said coupling means are capacitors.

4. The phase shifter of claim 2 in which said amplifier is a transistor with one electrode grounded and the other two electrodes connected respectively to said first and second terminals.

5. The phase shifter of claim 1 in which said amplifier circuit comprises three ports, one connected to said first terminal, one connected to said second terminal and one connected to a third terminal intermediate said first and second terminals.

6. The phase shifter of claim 1 in which said transmission medium introduces approximately a 90° phase shift and said amplifier circuit introduces an inherent phase shift of approximately 180°.

7. The phase shifter of claim 1 further including impedance matching circuits interconnected with each of said terminals.

8. A three-port circulator comprising:
   three bi-directional phase shifters each including a transmission medium connected between first and second terminals and having a predetermined phase shift which is the same in each direction; and
   an amplifier circuit connected in parallel with the transmission medium between the first and second terminals for introducing its inherent phase shift in one direction and a phase shift in excess of its inherent phase shift in the other direction for establishing a non-reciprocal phase shift;
   said phase shifters being interconnected in a ring with the first terminal of each shifter being interconnected with the second terminal of another.

9. The three-port circulator of claim 8 in which the first terminal of each of said phase shifters is interconnected with the second terminal of another phase shifter through at least one impedance matching element.

10. A four-port circulator comprising:
    at least one non-reciprocal bi-directional phase shifter including a transmission medium connected between first and second terminals and having a predetermined phase shift which is the same in each direction; and an amplifier circuit connected in parallel with the transmission medium between the first and second terminals for introducing its inherent phase shift in one direction and a phase shift in excess of its inherent phase shift in the other direction for establishing a non-reciprocal phase shift;
    a second bi-directional phase shifter; and
    a passive four-port coupling network interconnecting said first and second phase shifters.

11. The four-port circulator of claim 10 in which said second bi-directional phase shifter is non-reciprocal.

12. The four-port circulator of claim 10 in which said second bi-directional phase shifter is reciprocal.

13. The four-port circulator of claim 10 in which said passive four-port coupling network includes at least one "magic-T" coupler.

14. The four-port circulator of claim 10 in which said passive four-port coupling network includes at least one directional coupler.

* * * * *